(12) United States Patent
Tadokoro et al.

(10) Patent No.: US 9,324,806 B2
(45) Date of Patent: Apr. 26, 2016

(54) SILICON CARBIDE SEMICONDUCTOR DEVICE

(71) Applicant: Mitsubishi Electric Corporation, Tokyo (JP)

(72) Inventors: Chihiro Tadokoro, Tokyo (JP); Yoichiro Tarui, Tokyo (JP); Koji Okuno, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/682,970

(22) Filed: Apr. 9, 2015

(65) Prior Publication Data
US 2015/0318357 A1 Nov. 5, 2015

(30) Foreign Application Priority Data

Apr. 30, 2014 (JP) ................................. 2014-093251

(51) Int. Cl.
*H01L 29/872* (2006.01)
*H01L 29/47* (2006.01)
*H01L 29/16* (2006.01)
*H01L 29/06* (2006.01)
*H01L 21/04* (2006.01)
*H01L 29/40* (2006.01)
*H01L 29/66* (2006.01)

(52) U.S. Cl.
CPC ........ *H01L 29/1608* (2013.01); *H01L 21/0495* (2013.01); *H01L 29/0611* (2013.01); *H01L 29/0619* (2013.01); *H01L 29/401* (2013.01); *H01L 29/402* (2013.01); *H01L 29/47* (2013.01); *H01L 29/6606* (2013.01); *H01L 29/872* (2013.01)

(58) Field of Classification Search
CPC ............ H01L 29/1608; H01L 29/0619; H01L 29/872
USPC .......................................................... 257/77
See application file for complete search history.

(56) References Cited

U.S. PATENT DOCUMENTS 6,831,345 B2   12/2004  Kinoshita et al.
7,049,675 B2    5/2006  Kinoshita et al.
(Continued)

FOREIGN PATENT DOCUMENTS

| JP | 2003-101039 A | 4/2003 |
| JP | 2005-286197 A | 10/2005 |
| JP | 2008-124362 A | 5/2008 |

(Continued)

*Primary Examiner* — Cuong Q Nguyen
(74) *Attorney, Agent, or Firm* — Studebaker & Brackett PC

(57) ABSTRACT

A silicon carbide semiconductor device includes: a silicon carbide semiconductor layer of a first conductivity type; a field insulating film formed on a surface of the silicon carbide semiconductor layer; a Schottky electrode formed on the surface of the silicon carbide semiconductor layer on an inner periphery side relative to the field insulating film, the Schottky electrode being formed to overlap onto the field insulating film; a front-surface electrode that covers the Schottky electrode and extends on the field insulating film beyond a peripheral edge of the Schottky electrode; and a terminal well region of a second conductivity type that is formed to be in contact with a part of the Schottky electrode in an upper part of the silicon carbide semiconductor layer and extends in the silicon carbide semiconductor layer on an outer periphery side relative to a peripheral edge of the front-surface electrode.

24 Claims, 12 Drawing Sheets

(56) References Cited

U.S. PATENT DOCUMENTS

2015/0001554 A1    1/2015  Imai
2015/0060882 A1*   3/2015  Tarui ................ H01L 29/36
                                                            257/77

FOREIGN PATENT DOCUMENTS

| JP | 2008-251772 A | 10/2008 |
| JP | 2008-252143 A | 10/2008 |
| JP | 2013-211503 A | 10/2013 |

* cited by examiner

F I G. 4
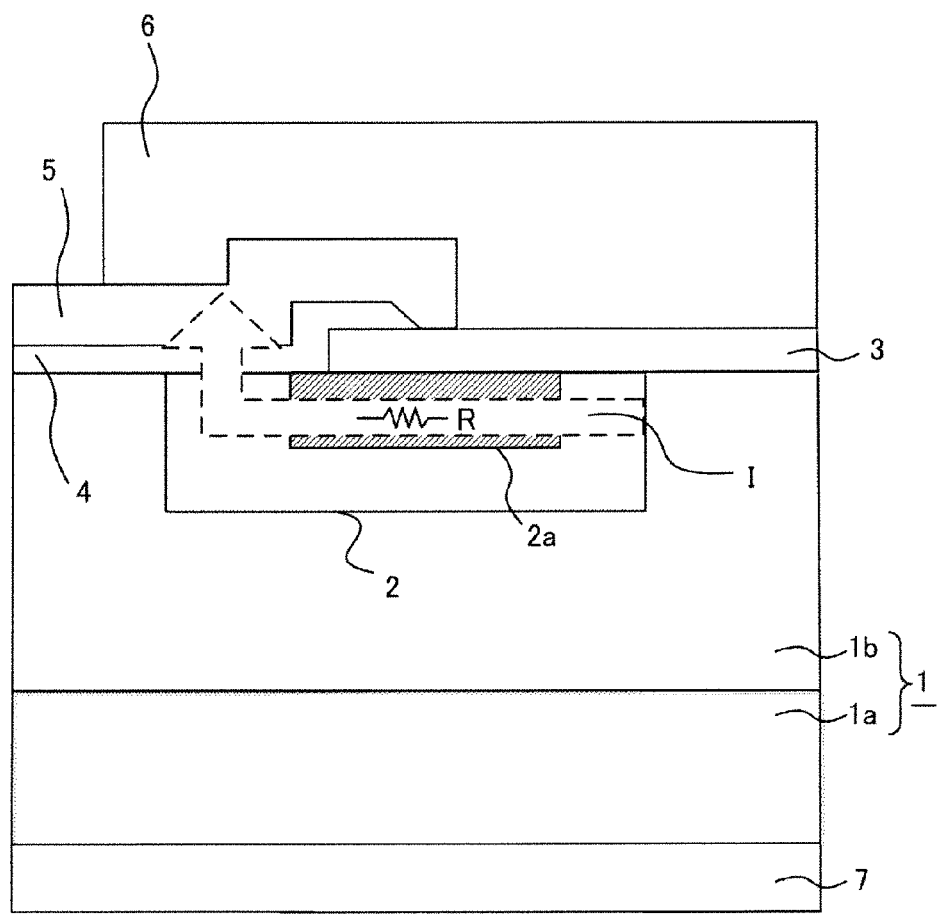

F I G. 6
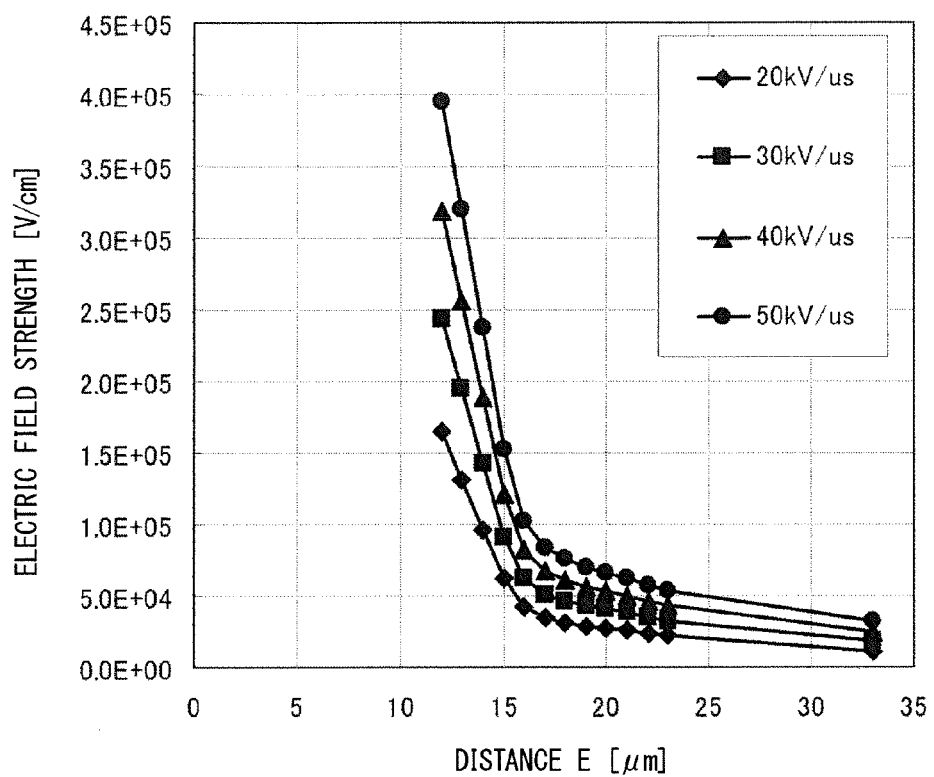

F I G. 7
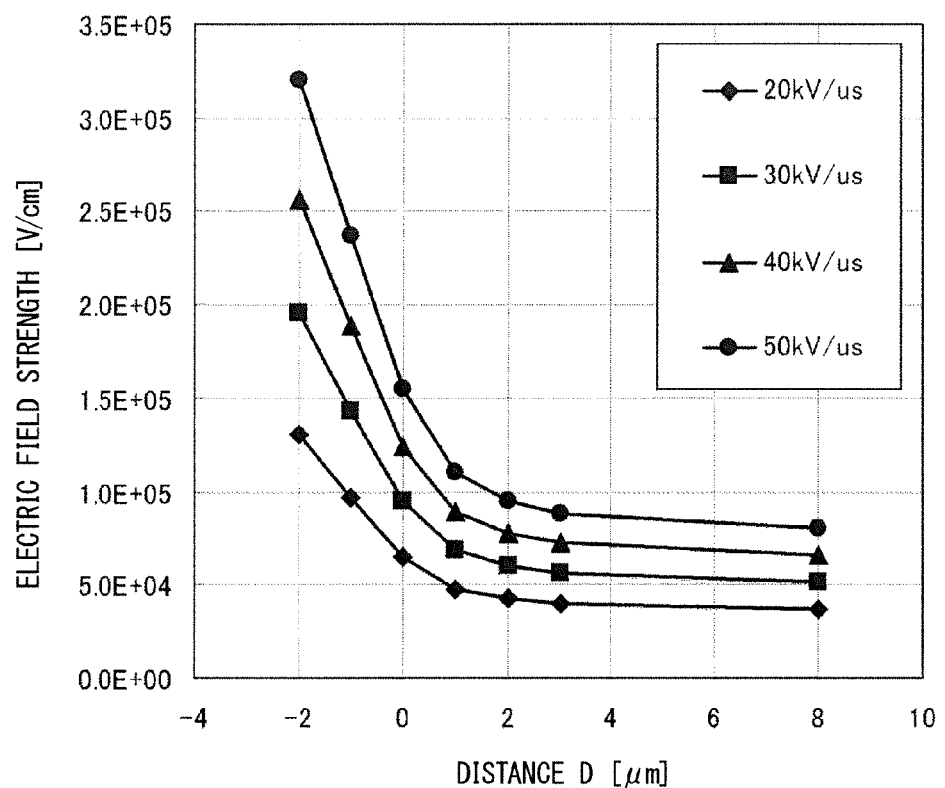

F I G. 9
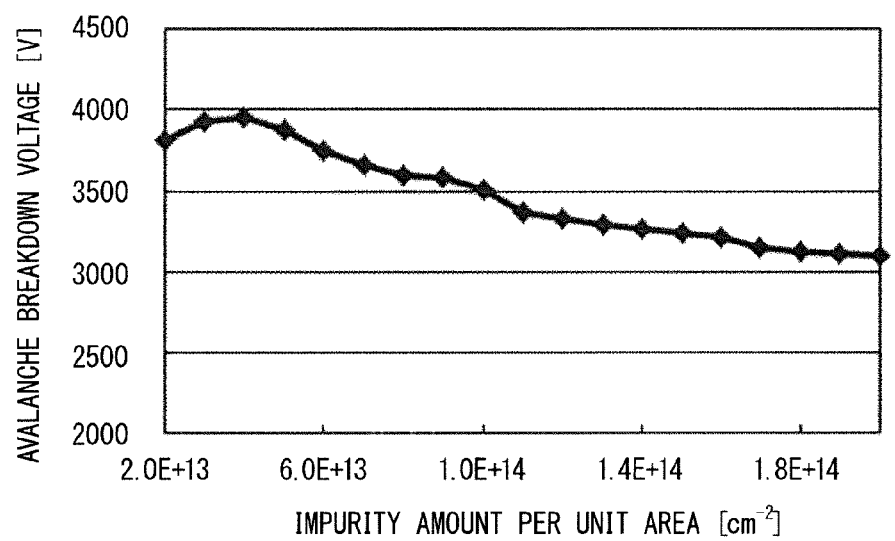

F I G. 1 1
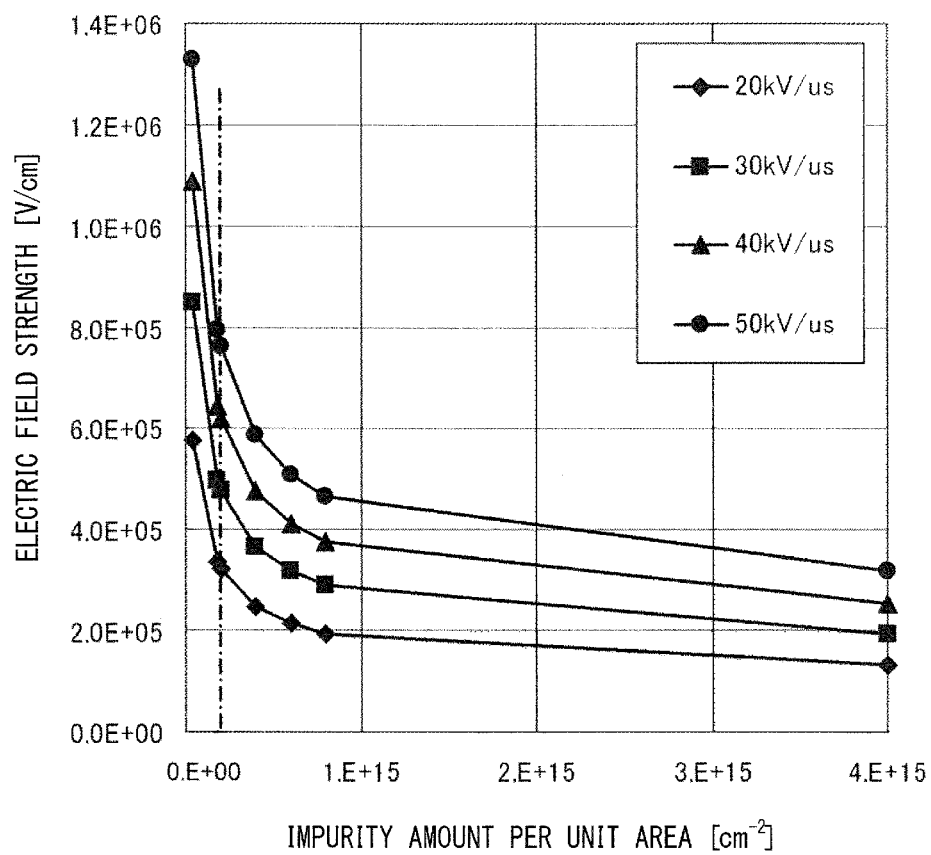
F I G. 1 2
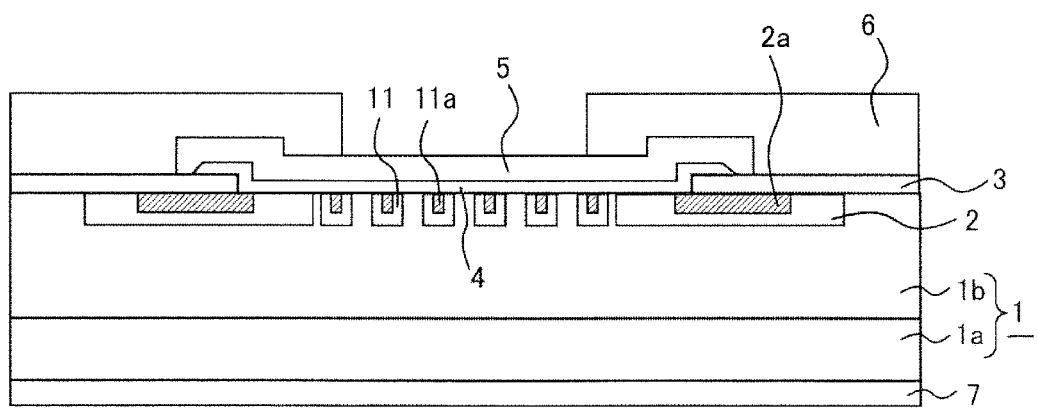

SILICON CARBIDE SEMICONDUCTOR DEVICE

BACKGROUND OF THE INVENTION

1. Field of the Invention

The present invention relates to a silicon carbide semiconductor device.

2. Description of the Background Art

Schottky barrier diodes (SBDs) are unipolar devices and are therefore capable of reducing switching loss compared with that of ordinary bipolar diodes. However, the conventional SBDs formed of silicon (Si) semiconductors only provide a breakdown voltage of about 50 V or less for practical use, thereby being unsuitable for uses such as high-voltage inverters. Therefore, attention has been given to the development of SBDs formed of silicon carbide (SiC-SBDs) in recent years because the use of silicon carbide (SiC), in place of silicon, as the constituent material of the SBDs allows for a breakdown voltage of about several kV.

As the technique known for improving the breakdown voltage in the SiC-SBDs, the P-type guard ring region (terminal well region) is provided in the so-called terminal region of the N-type silicon carbide semiconductor layer, so that the electric filed generated in application of a reverse voltage is alleviated by the depletion layer formed by the PN junction between the silicon carbide semiconductor layer and the guard ring region (for example, Japanese Patent Application Laid-Open No. 2005-286197).

Meanwhile, an etching residue is, in some cases, formed at the peripheral edge of the Schottky electrode disposed on the surface of the silicon carbide semiconductor layer. The formation of etching residue may cause the silicon carbide semiconductor device to malfunction. Therefore, the front-surface electrode disposed on the Schottky electrode covers the peripheral edge of the Schottky electrode, so that the etching residue formed at the peripheral edge of the Schottky electrode is prevented from being exposed. This technique has been known for suppressing malfunction of silicon carbide semiconductor devices (see, for example, Japanese Patent Application Laid-Open No. 2013-211503).

The technique of providing the high-concentration terminal well region having the higher P-type impurity concentration in the terminal well region has been known for further improving the breakdown voltage (see, for example, Japanese Patent Application Laid-Open No. 2008-251772).

Even in such a silicon carbide semiconductor device, however, it is newly found that, in switching from the conduction state in which an on-state current flows to the blocking state in which a reverse voltage is applied, the electric field may be concentrated in the peripheral edge of the front-surface electrode, possibly causing breakdown voltage failure. The electric field concentration in the peripheral edge of the front-surface electrode in switching is assumed to occur by the mechanism described below.

When the conduction state changes to the blocking state in which a reverse voltage is applied, the voltage applied onto the silicon carbide semiconductor device increases and varies, thereby generating a displacement current that charges the depletion-layer capacitance formed in the PN junction portion between the terminal well region and the silicon carbide semiconductor layer. The displacement current flows from the inside of the terminal well region toward the Schottky-electrode side. The flow of the displacement current causes a voltage drop in the terminal well region because the terminal well region has the specific resistance value. This causes a difference in electric potential between the inside of the terminal well region and the Schottky electrode, whereby an electric field is generated and the electric field concentration occurs in the peripheral edge of the Schottky electrode.

The electric field generated in switching is determined by the magnitude of displacement current and the resistance value in the terminal well region. The SiC-SBD is a unipolar device and is therefore capable of switching at an increased speed compared to that of the silicon diode having the same breakdown voltage. Thus, the voltage variation in switching becomes larger, resulting in an increase in displacement current value. In addition, the silicon carbide semiconductor has a large difference in energy level between the acceptor and the valence band, so that the resistance value in the terminal well region of the silicon carbide semiconductor is larger than that of the conventional silicon semiconductor. Therefore, both the displacement current value and the resistance value in the terminal well region are large in the SiC-SBD, thereby particularly increasing the electric field generated in switching. Thus, the electric field concentration in switching has been likely to cause element failure in the conventional SiC-SBD.

SUMMARY OF THE INVENTION

The present invention has an object to provide a silicon carbide semiconductor device capable of alleviating the electric field concentration occurring in switching.

A silicon carbide semiconductor device according to the present invention includes: a silicon carbide semiconductor layer of a first conductivity type; a field insulating film formed on a surface of the silicon carbide semiconductor layer; a Schottky electrode formed on the surface of the silicon carbide semiconductor layer on an inner periphery side relative to the field insulating film, a peripheral edge of the Schottky electrode being formed to overlap onto the field insulating film; a front-surface electrode that covers the Schottky electrode and extends on the field insulating film beyond the peripheral edge of the Schottky electrode; a terminal well region of a second conductivity type that is formed to be in contact with a part of the Schottky electrode in an upper part of the silicon carbide semiconductor layer and extends in the silicon carbide semiconductor layer on an outer periphery side relative to a peripheral edge of the front-surface electrode; and a high-concentration terminal well region of the second conductivity type that is formed in the terminal well region and has a second-conductivity-type impurity concentration higher than that of the terminal well region. The peripheral edge of the front-surface electrode is located at a distance of 15 µm or more inward from a peripheral edge of the terminal well region.

In the silicon carbide semiconductor device described above, the peripheral edge of the front-surface electrode is located at a distance of 15 µm or more inward from the peripheral edge of the terminal well region. Therefore, the distance between the peripheral edge of the terminal well region having the highest electric potential and the peripheral edge of the front-surface electrode can be secured, which alleviates the density of the equipotential surfaces located between the peripheral edge of the terminal well region and the peripheral edge of the front-surface electrode, thereby alleviating the electric field generated at the peripheral edge of the front-surface electrode by the displacement current occurring in switching.

These and other objects, features, aspects and advantages of the present invention will become more apparent from the

BRIEF DESCRIPTION OF THE DRAWINGS

FIG. 4 is a cross-sectional view schematically showing the configuration of the silicon carbide semiconductor device according to the first preferred embodiment;

FIGS. 6 and 7 are graphs showing simulation results on the silicon carbide semiconductor device according to the first preferred embodiment;

FIG. 9 is a graph showing simulation results on the silicon carbide semiconductor device according to the first preferred embodiment;

FIG. 11 is a graph showing simulation results on the silicon carbide semiconductor device according to the first preferred embodiment; and FIGS. 12, 13, and 14 are cross-sectional views schematically showing configurations of modifications of the silicon carbide semiconductor device according to the first preferred embodiment.

DESCRIPTION OF THE PREFERRED EMBODIMENTS

The "impurity amount per unit area [$cm^{-2}$]" of each region herein refers to the value obtained by integrating the impurity concentration of each region in the depth direction. In a case where the impurity concentration of each region has a concentration profile, the "impurity concentration [$cm^{-3}$]" of each region herein refers to the peak value of the impurity concentration of each region. In a case where the impurity concentration of each region has a concentration profile, the "thickness" of each region herein refers to the thickness of the region in which the impurity concentration value is not less than one-tenth of the peak value of the impurity concentration of the region. Note that the "impurity concentration" that is referred to in calculating the "impurity amount per unit area [$cm^{-2}$]" of each region is not the peak value of the impurity concentration but the actual impurity concentration.

The expression "on ~" herein does not exclude the possibility that an interposition is located between the constituent elements. For example, "B disposed on A" refers to B with or without another constituent element C disposed between A and B.

First Preferred Embodiment

Firstly, a configuration of a silicon carbide semiconductor device 100 according to a first preferred embodiment of the present invention is described. Although an example of an N-type silicon carbide Schottky barrier diode (SiC-SBD) in which the first conductivity type is the N type and the second conductivity type is the P type is described below, a P-type SiC-SBD in which the first conductivity type is the P type and the second conductivity type is the N type may be used.

Figure 1A:
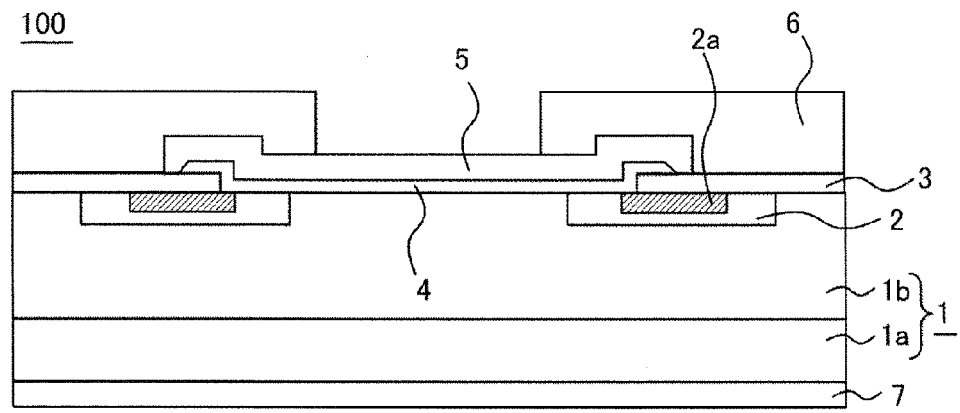
FIGS. 1A and 1B are a cross-sectional view and a plan view schematically showing a configuration of a silicon carbide semiconductor device according to a first preferred embodiment.
Figure 1B:
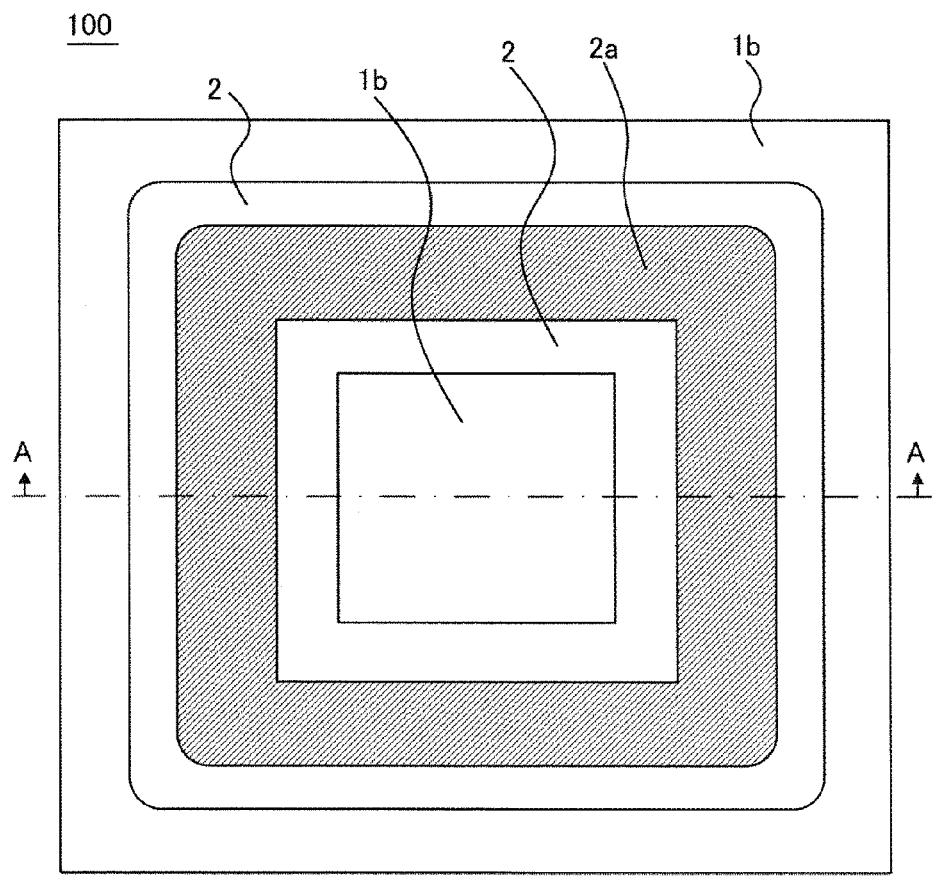

FIGS. 1A and 1B are a cross-sectional view and a plan view showing the configuration of the silicon carbide semiconductor device 100 according to the first preferred embodiment. In FIG. 1B, electrodes, insulating films, and the like that are formed on a silicon carbide semiconductor layer 1b of the silicon carbide semiconductor device 100 are omitted. FIG. 1A is a view corresponding to a cross section taken along the line A-A in FIG. 1B. The electrodes, the insulating films, and the like that are formed on the silicon carbide semiconductor layer 1b are shown in FIG. 1A.

With reference to FIG. 1A, the silicon carbide semiconductor device 100 is a Schottky barrier diode (SBD) including a silicon carbide substrate 1, a field insulating film 3, a Schottky electrode 4, a front-surface electrode 5, a surface protective film 6, and a rear-surface electrode 7. The silicon carbide substrate 1 includes a substrate layer 1a of the N+ type that is formed of silicon carbide and the silicon carbide semiconductor layer 1b (drift layer) of the N− type that is formed on the substrate layer 1a. A terminal well region 2 of the P type is formed in the so-called terminal region located in the upper part of the silicon carbide semiconductor layer 1b. A high-concentration terminal well region 2a of the P+ type is formed in the terminal well region 2. More specifically, the high-concentration terminal well region 2a is located inside the terminal well region 2 and is desirably kept from reaching the PN junction portion between the terminal well region 2 and the silicon carbide semiconductor layer 1b.

Nitrogen (N) and phosphorus (P) may be used as the N-type impurities and aluminum (Al) and boron (B) may be used as the P-type impurities. In this preferred embodiment, nitrogen is used as the N-type impurities and aluminum is used as the P-type impurities. The silicon carbide semiconductor layer 1b has the N-type impurity concentration lower than that of the substrate layer 1a. The N-type impurity concentration and the thickness of the silicon carbide semiconductor layer 1b are set in accordance with the design breakdown voltage of the silicon carbide semiconductor device 100. The P-type impurity amount in the terminal well region 2 per unit area is desirably set at $1.0 \times 10^{13}/cm^2$ to $1.0 \times 10^{14}/cm^2$ and is more preferably set at $2.0 \times 10^{13}/cm^2$ to $5.0 \times 10^{13}/cm^2$. In this preferred embodiment, the P-type impurity amount in the terminal well region 2 per unit area is $2.0 \times 10^{13}/cm^2$. The P-type impurity amount in the high-concentration terminal well region 2a per unit area is desirably larger than the P-type impurity amount in the terminal well region 2 per unit area and is desirably set at $2.0 \times 10^{14}/cm^2$ or more. In this preferred embodiment, the P-type impurity amount in the high-concentration terminal well region 2a per unit area is $4.0 \times 10^{14}/cm^2$.

As shown in FIG. 1B, the terminal well region 2 and the high-concentration terminal well region 2a respectively have a ring shape in the plane direction. As shown in FIG. 1B, the terminal well region 2 is formed in a part of the silicon carbide semiconductor layer 1b and the high-concentration terminal well region 2a is formed in a part of the terminal well region 2.

Referring back to FIG. 1A, the field insulating film 3 and the Schottky electrode 4 are formed on the surface of the silicon carbide semiconductor layer 1b. The Schottky electrode 4 is formed on the central part of the surface of the silicon carbide semiconductor layer 1b and forms a Schottky junction with the silicon carbide semiconductor layer 1b. The field insulating film 3 is formed on the so-called terminal region located on the surface of the silicon carbide semiconductor layer 1b on the outer periphery side relative to the Schottky electrode 4 and surrounds the part in which the Schottky electrode 4 forms a Schottky junction with the silicon carbide semiconductor layer 1b. The Schottky electrode 4 is partially located on the terminal well region 2 and the high-concentration terminal well region 2a and is in contact with the respective regions. The Schottky electrode 4 is formed to overlap onto the field insulating film 3 and the peripheral edge of the Schottky electrode 4 is located on the field insulating film 3.

The field insulating film 3 may be formed of silicon oxide ($SiO_2$) or silicon nitride (SiN) and may have a thickness of, for example, 0.5 µm to 1.5 µm. In this preferred embodiment, a $SiO_2$ film having a thickness of 1.0 µm is used as the field insulating film 3. The Schottky electrode 4 may be formed of a metal that comes in Schottky contact with the silicon carbide semiconductor. The Schottky electrode 4 may be formed of a metal such as titanium, molybdenum, nickel, and gold and may have a thickness of, for example, 100 nm to 300 nm. In this preferred embodiment, a titanium film having a thickness of 200 nm is used as the Schottky electrode 4.

The front-surface electrode 5 is formed on the Schottky electrode 4. The front-surface electrode 5 covers the peripheral edge of the Schottky electrode 4. That is, the peripheral edge of the front-surface electrode 5 is located on the field insulating film 3 beyond the peripheral edge of the Schottky electrode 4. The front-surface electrode 5 may be formed of, for example, a metal containing any of aluminum, copper, molybdenum, and nickel or of an aluminum alloy such as Al—Si and may have a thickness of, for example, 3.0 µm to 6.0 µm. In this preferred embodiment, an aluminum layer having a thickness of 4.8 µm is used as the front-surface electrode 5.

The peripheral edge of the front-surface electrode 5 is located over the terminal well region 2. The peripheral edge of the front-surface electrode 5 is desirably located at a distance of 15 µm or more inward from the peripheral edge of the terminal well region 2. The peripheral edge of the front-surface electrode 5 is located over the high-concentration terminal well region 2a. The peripheral edge of the front-surface electrode 5 is desirably located at a distance of 2 µm or more inward from the peripheral edge of the high-concentration terminal well region 2a.

The surface protective film 6 is formed on the field insulating film 3 and the front-surface electrode 5. The surface protective film 6 is formed to cover the peripheral edge of the front-surface electrode 5 and has an opening over the central portion of the front-surface electrode 5 to form the connection with the external terminals. To relax the stress from the external environment, the surface protective film 6 is desirably an organic resin film. In this preferred embodiment, polyimide is used as the surface protective film 6.

The rear-surface electrode 7 is formed on the rear-surface side of the silicon carbide substrate 1 (the substrate layer 1a). The rear-surface electrode 7 forms an ohmic junction with the substrate layer 1a. Thus, the rear-surface electrode 7 may be made of a metal such as nickel, aluminum, and molybdenum that are capable of forming an ohmic junction with silicon carbide serving as the substrate layer 1a. In this preferred embodiment, nickel is used as the rear-surface electrode 7.

Next, a method for manufacturing the silicon carbide semiconductor device 100 is described. FIGS. 2A, 2B, 2C, 3A, 3B, and 3C are cross-sectional views showing the respective processes in the method for manufacturing the silicon carbide semiconductor device 100.

Figure 2A:
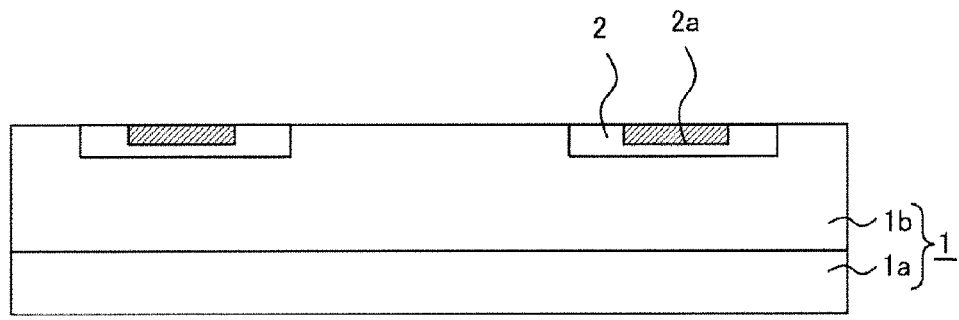
FIGS. 2A, 2B, and 2C are cross-sectional views showing a method for manufacturing the silicon carbide semiconductor device according to the first preferred embodiment.

With reference to FIG. 2A, the silicon carbide substrate 1 formed of the substrate layer 1a of the N+ type and the silicon carbide semiconductor layer 1b of the N− type that is epitaxially grown on the upper surface of the substrate layer 1a is prepared. Then, a resist film (not shown) is patterned into a predetermined shape by a known method such as the photolithography technique. After that, the P-type impurities are selectively ion-implanted from above the resist film, to thereby form the terminal well region 2 (guard ring region) of the P type in the upper part of the silicon carbide semiconductor layer 1b. In addition, the high-concentration terminal well region 2a of the P type is formed in the terminal well region 2 in a similar way.

The P-type impurity region is implanted with impurity ions such as aluminum ions or boron ions. Subsequent to the ion implantation, the impurity ions are electrically activated by annealing at a high temperature of 1500° C. or above, to thereby form the region of the predetermined conductivity type. As described above, the P-type impurity amount in the terminal well region 2 per unit area is desirably set at $1.0 \times 10^{13}/cm^2$ to $1.0 \times 10^{14}/cm^2$. In this preferred embodiment, the P-type impurity amount in the terminal well region 2 per unit area is $2.0 \times 10^{13}/cm^2$. The P-type impurity amount in the high-concentration terminal well region 2a per unit area is desirably set at $2.0 \times 10^{14}/cm^2$ to $1.0 \times 10^{15}/cm^2$. In this preferred embodiment, the P-type impurity amount in the high-concentration terminal well region 2a per unit area is $4.0 \times 10^{14}/cm^2$. In a case where the defects generated in the silicon carbide semiconductor layer 1b are likely to increase due to ion implantation in, for example, forming the high-concentration terminal well region 2a containing a large amount of P-type impurities, ion implantation is preferably carried out under a temperature condition of 150° C. or above.

The P-type impurities are ion-implanted with an implantation energy of, for example, 100 keV to 700 keV. In this case, if the above-mentioned impurity amount in each region per unit area [$cm^{-2}$] is converted into the impurity concentration [$cm^{-3}$], the impurity concentration of the terminal well region 2 is $1.0 \times 10^{17}/cm^3$ to $1.0 \times 10^{19}/cm^3$ and the impurity concentration of the high-concentration terminal well region 2a is $8.0 \times 10^{17}/cm^3$ to $2.0 \times 10^{20}/cm^3$.

Figure 2B:
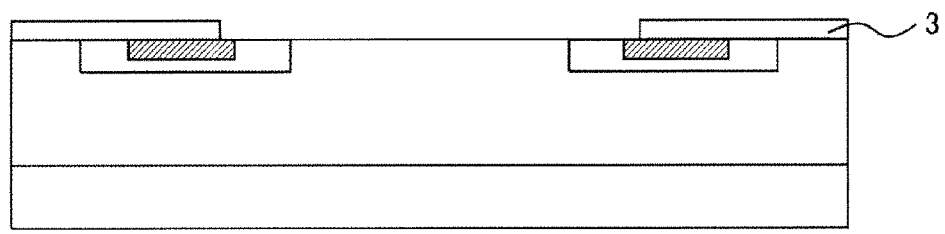

Subsequently, with reference to FIG. 2B, a silicon oxide film having a thickness of 1.0 µm is deposited on the surface of the silicon carbide semiconductor layer 1b by, for example, the chemical vapor deposition (CVD) method. Then, the central part of the silicon oxide film is removed by a photolithography and an etching, whereby the field insulating film 3 having an opening is formed. The opening edge of the field insulating film 3 is formed to be located on the terminal well region 2, more preferably, on the high-concentration terminal well region 2a. Therefore, the Schottky electrode 4 formed in the processes described below is in contact with the terminal well region 2 and the high-concentration terminal well region 2a, whereby the contact resistance of the Schottky electrode 4 can be reduced.

Figure 2C:
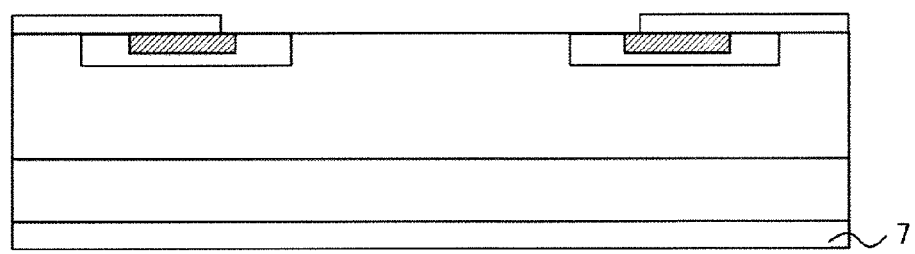

Then, with reference to FIG. 2C, the rear-surface electrode 7 is formed on the rear-surface side of the substrate layer 1a of the silicon carbide substrate 1. Alternatively, the rear-surface electrode 7 may be formed after all of the processes on the front-surface side of the silicon carbide substrate 1 that are described below are completed.

Figure 3A:
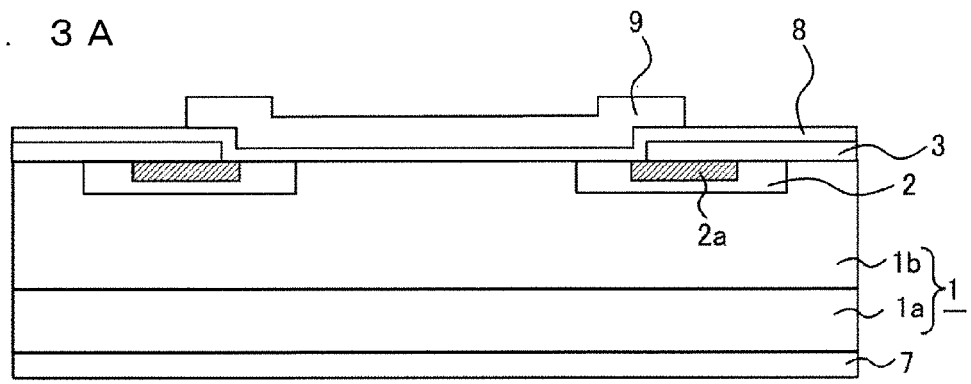
FIGS. 3A, 3B, and 3C are cross-sectional views showing the method for manufacturing the silicon carbide semiconductor device according to the first preferred embodiment.
Figure 3B:
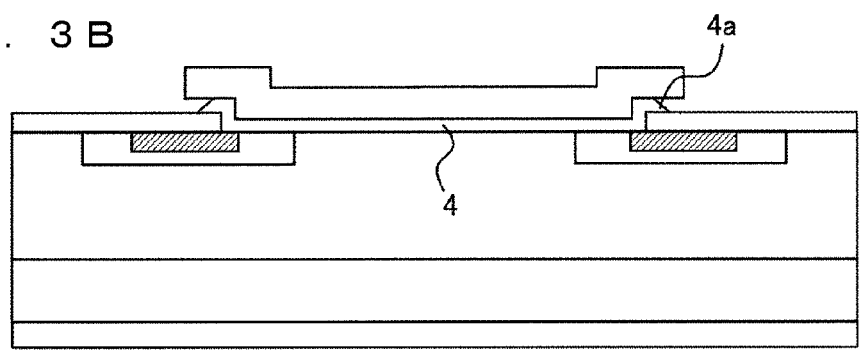

Next, with reference to FIG. 3A, a metal film 8 serving as the Schottky electrode 4 is formed, by sputtering, on the entire surface of the silicon carbide semiconductor layer 1b having the field insulating film 3 formed thereon. In this preferred embodiment, the metal film 8 to be formed is a titanium film having a thickness of 200 nm. Then, a resist film 9 having a given pattern shape is formed by the photolithography technique. After that, with reference to FIG. 3B, the metal film 8 is etched using the resist film 9 as a mask, thereby forming the Schottky electrode 4 having a desired shape (FIG. 3B). Although the metal film 8 may be dry-etched or wet-etched, the wet etching is desirably employed to reduce damages to the chip. For example, hydrofluoric acid (HF) is used as an etchant. The end of the Schottky electrode 4 having a reduced thickness is likely to be sharpened owing to, for example, the relation between the metallic material and the etchant. In FIG. 3B, the sharpened portion formed at the end of the Schottky electrode 4 is referred to as an etching residue 4a.

Figure 3C:
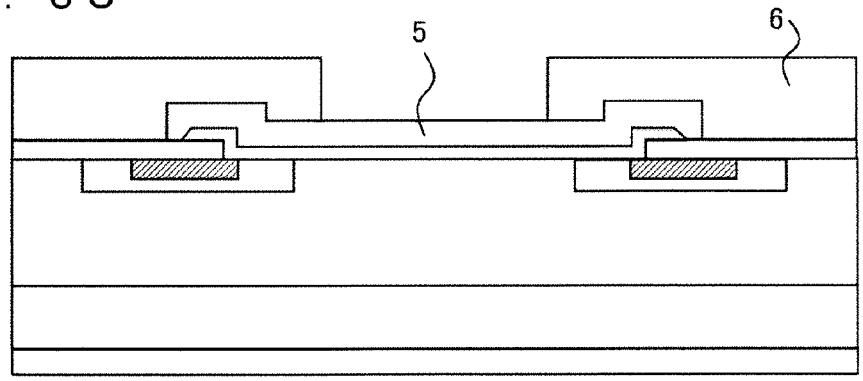

Subsequently, with reference to FIG. 3C, the front-surface electrode 5 is formed on the field insulating film 3 and the Schottky electrode 4 to cover the Schottky electrode 4, in other words, to cover the etching residue 4a. As in forming the Schottky electrode 4, a given metal film is formed on the entire surface, and then, an etching is performed, to thereby form the front-surface electrode 5. The metal film is wet-etched using an etchant based on, for example, phosphoric acid. Then, the surface protective film 6 is formed to cover the front-surface electrode 5, whereby the silicon carbide semiconductor device 100 according to this preferred embodiment is completed.

Next, an operation of the silicon carbide semiconductor device 100 according to this preferred embodiment is described. In the silicon carbide semiconductor device according to this preferred embodiment, when a voltage is applied such that the electric potential of the rear-surface electrode 7 is set negative relative to the front-surface electrode 5, a current flows from the front-surface electrode 5 toward the rear-surface electrode 7, thereby transforming the silicon carbide semiconductor device 100 into the conductive state (on state). When a voltage is applied such that the electric potential of the rear-surface electrode 7 is set positive relative to the front-surface electrode 5, meanwhile, a current is blocked by the Schottky junction between the Schottky electrode 4 and the silicon carbide semiconductor layer 1b and the PN junction between the terminal well region 2 and the silicon carbide semiconductor layer 1b, thereby transforming the silicon carbide semiconductor device 100 into the blocking state (off state).

Functions and effects of the silicon carbide semiconductor device 100 according to this preferred embodiment are described below.

Unlike in this preferred embodiment, in a case where the field insulating film 3 is not provided and the entire surface of the Schottky electrode 4 is formed on the silicon carbide semiconductor layer 1b, the curvature of the equipotential surfaces increases around the end of the junction surface between the Schottky electrode 4 and the silicon carbide semiconductor layer 1b, whereby the electric field is concentrated in the vicinity of the peripheral edge of the Schottky electrode 4. Thus, the Schottky electrode 4 is formed to overlap onto the field insulating film 3 as in this preferred embodiment, to thereby alleviate the concentration of electric field in the peripheral edge of the Schottky electrode 4. In a case where the field insulating film 3 is provided, by forming the Schottky electrode 4 to overlap onto the field insulating film 3, the margin for alignment between the peripheral edge of the Schottky electrode 4 and the opening edge of the field insulating film 3 can be enlarged, whereby the manufacturing process can be simplified.

The etching residue 4a is formed at the peripheral edge of the Schottky electrode 4, possibly causing a problem of the electric field concentration in the vicinity of the etching residue 4a. Although the etching residue may be generated in each case where the Schottky electrode 4 or the front-surface electrode 5 is etched and in each case where a dry etching or a wet etching is performed, the etching residue is particularly likely to be generated in forming the Schottky electrode 4 owing to the thickness of the metal film and the relation between the metallic material and the etchant. There has been a concern that, depending on, for example, the shape of the etching residue 4a, the reliability of the silicon carbide semiconductor device may be degraded due to the concentration of electric field occurring in the peripheral edge portion of the Schottky electrode 4.

In this preferred embodiment, the front-surface electrode 5 is formed to cover the peripheral edge of the Schottky electrode 4, so that the etching residue 4a formed at the peripheral edge of the Schottky electrode 4 is not exposed. Therefore, there is no possibility of a problem caused by the electric field at the end of the Schottky electrode 4 even if the etching residue 4a is generated in the Schottky electrode 4. Meanwhile, if the end (etching residue 4a) of the Schottky electrode 4 is covered by the front-surface electrode 5, the peripheral edge of the front-surface electrode 5, in place of the etching residue 4a of the Schottky electrode 4, becomes the electric field concentration point. However, compared to the Schottky electrode 4, the front-surface electrode 5 is less likely to form an etching residue. Even if an etching residue is formed, the etching residue of the front-surface electrode 5 is not as sharp as that of the Schottky electrode 4. Therefore, the electric field concentration in the end of the electrode can be alleviated.

In a case where the front-surface electrode 5 covers the Schottky electrode 4 as in this preferred embodiment, the peripheral edge of the front-surface electrode 5 is further stretched to the outer periphery side relative to the conventional position. Thus, the position of the peripheral edge of the front-surface electrode 5 needs to be adjusted in light of the viewpoints described below.

The terminal well region 2 formed in the terminal region of the silicon carbide semiconductor layer 1b forms a PN junction with the silicon carbide semiconductor layer 1b. Around the PN junction, an electric double layer referred to as a depletion layer is formed. The depletion layer has a capacitance referred to as a depletion-layer capacitance. The depletion-layer capacitance is charged and discharged when the voltage applied onto the PN junction between the silicon carbide semiconductor layer 1b and the terminal well region 2 changes. Thus, in switching of the silicon carbide semiconductor device 100, the voltage applied onto the PN junction between the silicon carbide semiconductor layer 1b and the terminal well region 2 changes, thereby generating a displacement current that charges and discharges the depletion-layer capacitance.

The displacement current flows from the front-surface electrode 5 to the PN junction portion on the terminal-well-region-2 side or flows from the rear-surface electrode 7 to the PN junction portion on the silicon-carbide-semiconductor-layer-1b side. When the displacement current is generated, the specific resistance value in the current path in which the displacement current flows causes a drop in voltage. For example, in the area extending between the front-surface electrode 5 and the PN junction portion on the terminal-well-region-2 side, as shown in FIG. 4, the displacement current flows through the terminal well region 2 from the peripheral edge of the terminal well region 2 toward the Schottky electrode 4 and the front-surface electrode 5, thereby causing a drop in voltage in the terminal well region 2. Thus, the electric potential in the terminal well region 2 increases (decreases) relative to the electric potential in the front-surface electrode 5, so that a high electric current is generated between the front-surface electrode 5 and the terminal well region 2.

The voltage drop caused by the displacement current is examined below. The voltage drop caused by the displacement current is determined by the displacement current value and the resistance value in the displacement current path. The value of the displacement current is obtained in Expression (1) below. In Expression (1), I represents a value of displacement current, Cd represents a depletion layer capacitance, and dV/dt represents a temporal variation of voltage applied onto the PN junction.

$$I = Cd * dV/dt \quad (1)$$

As shown in Expression (1), the displacement current I is determined by the depletion-layer capacitance Cd of the PN junction and the temporal variation dV/dt of the voltage applied onto the PN junction. The depletion-layer capacitance of the PN junction is determined by the P-type impurity concentration or the N-type impurity concentration. Silicon carbide has the dielectric breakdown strength higher than that of silicon. This allows the silicon carbide semiconductor layer to be implanted with the impurities having an increased concentration compared to the silicon semiconductor layer. Thus, in general, the impurity concentration is higher in the silicon carbide semiconductor device than in the silicon semiconductor device. Therefore, the depletion-layer capacitance of the PN junction is also higher in the silicon carbide semiconductor device than in the silicon semiconductor device.

A bipolar device made of silicon is expected to be transformed into a unipolar device made of silicon carbide given that these semiconductor devices are comparable in breakdown voltage. For example, a SiC-SBD such as the one described in this preferred embodiment is expected to be used in place of a Si-PN diode. If this is the case, the voltage variation dV/dt is increased because the SiC-SBD, which is a unipolar device, has a switching speed faster than that of the Si-PN diode, which is a bipolar device. Therefore, the silicon carbide semiconductor device conceivably has a displacement current value several dozen times larger than that of the silicon semiconductor device given that these devices have the same breakdown voltage.

Meanwhile, the resistance value (sheet resistance) in the terminal well region 2 of the P type, which is higher than other resistance values in the displacement current path, is shown to be larger in a silicon carbide semiconductor than in a silicon semiconductor. The reason for this is as follows. As shown in Table 1, the energy level of acceptor is deeper in the so-called wide band gap semiconductor including a silicon carbide semiconductor, so that the difference between the energy level of acceptor and the energy level of valence band is increased, resulting in a low ionization rate of acceptor. Therefore, the sheet resistance value in the silicon carbide semiconductor layer has, in some cases, increased by about several dozen times compared to that of the silicon semiconductor layer given that the both layers have equal impurity concentrations.

TABLE 1

| semiconductor | Si | SiC | GaN | Diamond |
|---|---|---|---|---|
| acceptor | B | Al | Mg | B |
| energy level | 45 meV | 210 meV | 160 meV | 360 meV |

As described above, in the SiC-SBD, the electric field generated by the displacement current has, in some cases, increased by several hundred times compared to that of the conventional silicon semiconductor device because both the displacement current amount and the resistance value in the displacement current path have increased. The electric field generated by the displacement current causes the concentration of electric field in the peripheral edge of the front-surface electrode 5 in switching. Therefore, there has been a possibility of element failure such as a dielectric breakdown of the insulating film (the field insulating film 3 or the surface protective film 6) around the peripheral edge of the front-surface electrode 5. Thus, in the SiC-SBD, not only the alleviation of the electric field generated in the blocking state (off state) but also the alleviation of the electric field generated by the displacement current occurring in switching has been found to be necessary.

As shown in FIG. 4, in switching (turning off), the displacement current flows from the peripheral edge of the terminal well region 2 toward the inner periphery side and feeds into the Schottky electrode 4 and the front-surface electrode 5, so that the peripheral edge of the terminal well region 2 has the highest electric potential. Between the peripheral edge of the front-surface electrode 5 and the peripheral edge of the terminal well region 2, an electric field is generated along with a drop in voltage caused by the displacement current. Therefore, if the peripheral edge of the front-surface electrode 5 approaches the peripheral edge of the terminal well region 2, the equipotential lines between the peripheral edge of the front-surface electrode 5 and the peripheral edge of the terminal well region 2 become closely spaced, thereby increasing the electric field around the angular peripheral edge of the front-surface electrode 5.

Figure 5A:
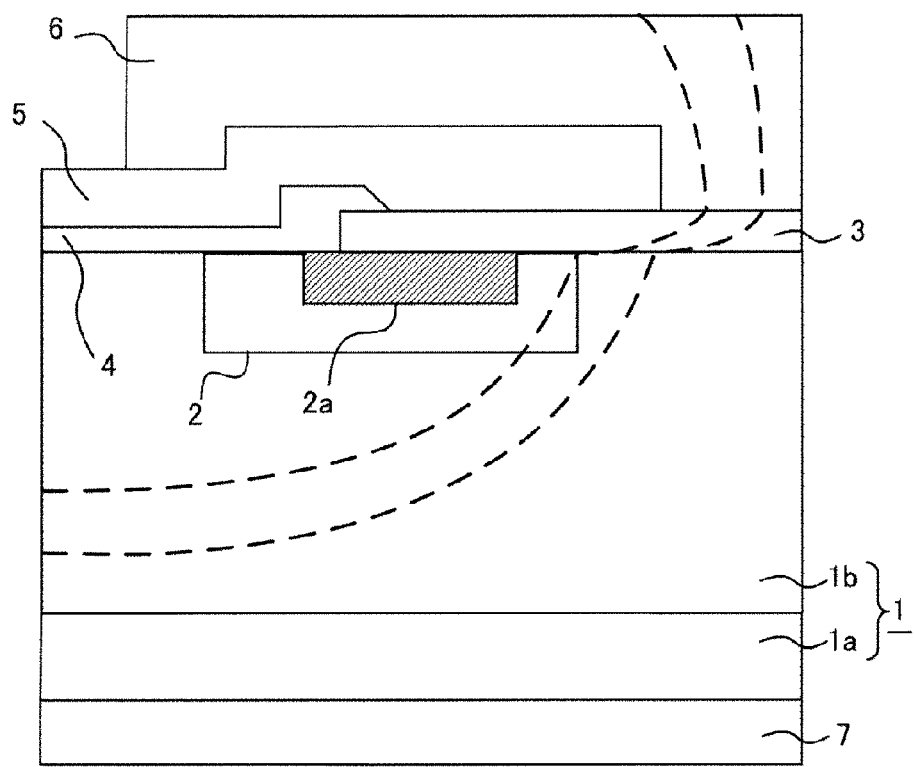
FIGS. 5A and 5B are cross-sectional views schematically showing a configuration of a comparative example of the silicon carbide semiconductor device according to the first preferred embodiment.

Thus, a sufficient distance needs to be secured between the peripheral edge of the front-surface electrode 5 and the peripheral edge of the terminal well region 2. However, as shown in FIG. 5A, if the peripheral edge of the front-surface electrode 5 is located on the outer periphery side relative to the peripheral edge of the terminal well region 2, the electric field concentration is likely to occur in the peripheral edge of the front-surface electrode 5 when a high voltage is applied onto the rear-surface electrode 7 in the static off-state. The reason for this is as follows. The depletion layer between the terminal well region 2 and the silicon carbide semiconductor layer 1b holds the high voltage in the off state. If the peripheral edge of the front-surface electrode 5 is stretched to the outer periphery side beyond the terminal well region 2, the equipotential lines extend to wrap around the peripheral edge of the front-surface electrode 5 as shown by the broken lines in FIG. 5A. This causes the electric field to be concentrated in the angular peripheral edge of the front-surface electrode 5.

Figure 5B:
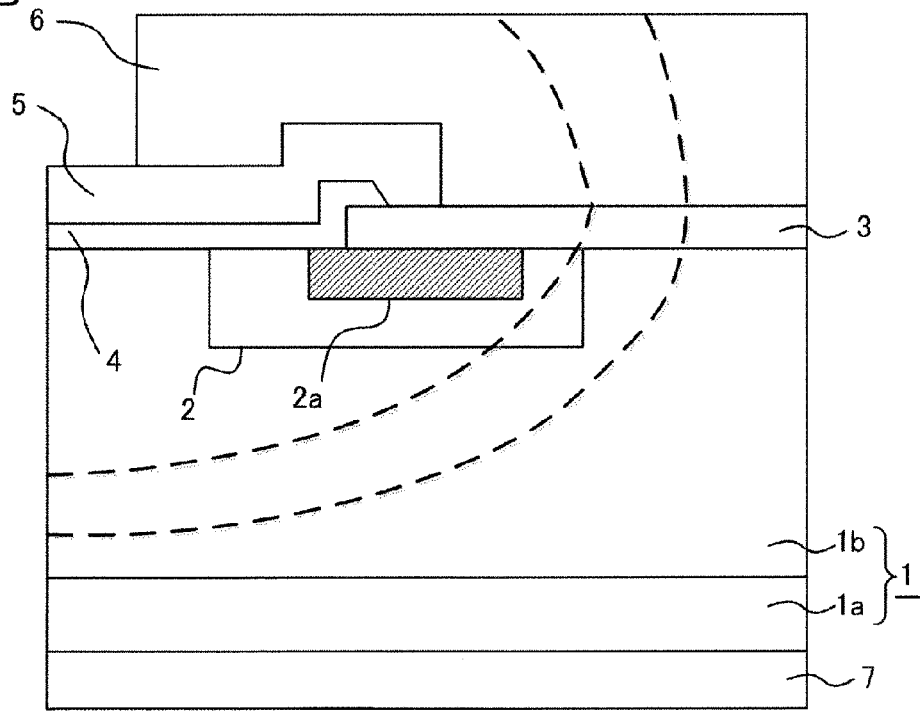

Meanwhile, as shown in FIG. 5B, if the peripheral edge of the front-surface electrode 5 is located over the terminal well region 2, the high voltage applied in the static off-state is held by the depletion layer extending from the terminal well region 2 and the depletion layer extending from high-concentration terminal well region 2a. This can prevent the equipotential lines, as shown by the broken lines in FIG. 5B, from extending to wrap around the peripheral edge of the front-surface electrode 5. Therefore, the electric field concentration in the peripheral edge of the front-surface electrode 5 in the static off-state can be prevented by positioning the peripheral edge of the front-surface electrode 5 over the terminal well region 2. Note that, the broken lines in FIGS. 5A and 5B schematically show the equipotential lines that are densely distributed, in particular, out of the equipotential lines in application of high voltage onto the rear-surface electrode 7 in the static off-state.

The above points must be taken into account in securing, on the terminal well region 2, the distance between the peripheral edge of the front-surface electrode 5 and the peripheral edge of the terminal well region 2 such that both the electric field concentration in the peripheral edge of the front-surface electrode 5 in the dynamic switching and the electric field concentration in the peripheral edge of the front-surface electrode 5 in the static off-state are alleviated.

FIGS. 6 and 7 show simulation results of the electric field strength at the peripheral edge of the front-surface electrode 5 in switching when the distance between the peripheral edge of the front-surface electrode 5 and the peripheral edge of the terminal well region 2 or the distance between the front-surface electrode 5 and the peripheral edge of the high-concentration terminal well region 2a is changed. In FIG. 6, the axis of ordinates shows the electric field strength at the peripheral edge of the front-surface electrode 5 and the axis of abscissas shows a distance E between the peripheral edge of the front-surface electrode 5 and the peripheral edge of the terminal well region 2. In FIG. 7, the axis of ordinates shows the electric field strength at the peripheral edge of the front-surface electrode 5 and the axis of abscissas shows a distance D between the peripheral edge of the front-surface electrode 5 and the peripheral edge of the high-concentration terminal well region 2a. In FIGS. 6 and 7, the diamond-shaped markers indicate the simulation results in the case where the value of dV/dt is 20 kV/μs, the square markers indicate the simulation results in the case where the value of dV/dt is 30 kV/μs, the triangular markers indicate the simulation results in the case where the value of dV/dt is 40 kV/μs, and the circular markers indicate the simulation results in the case where the value of dV/dt is 50 kV/μs.

Figure 8:
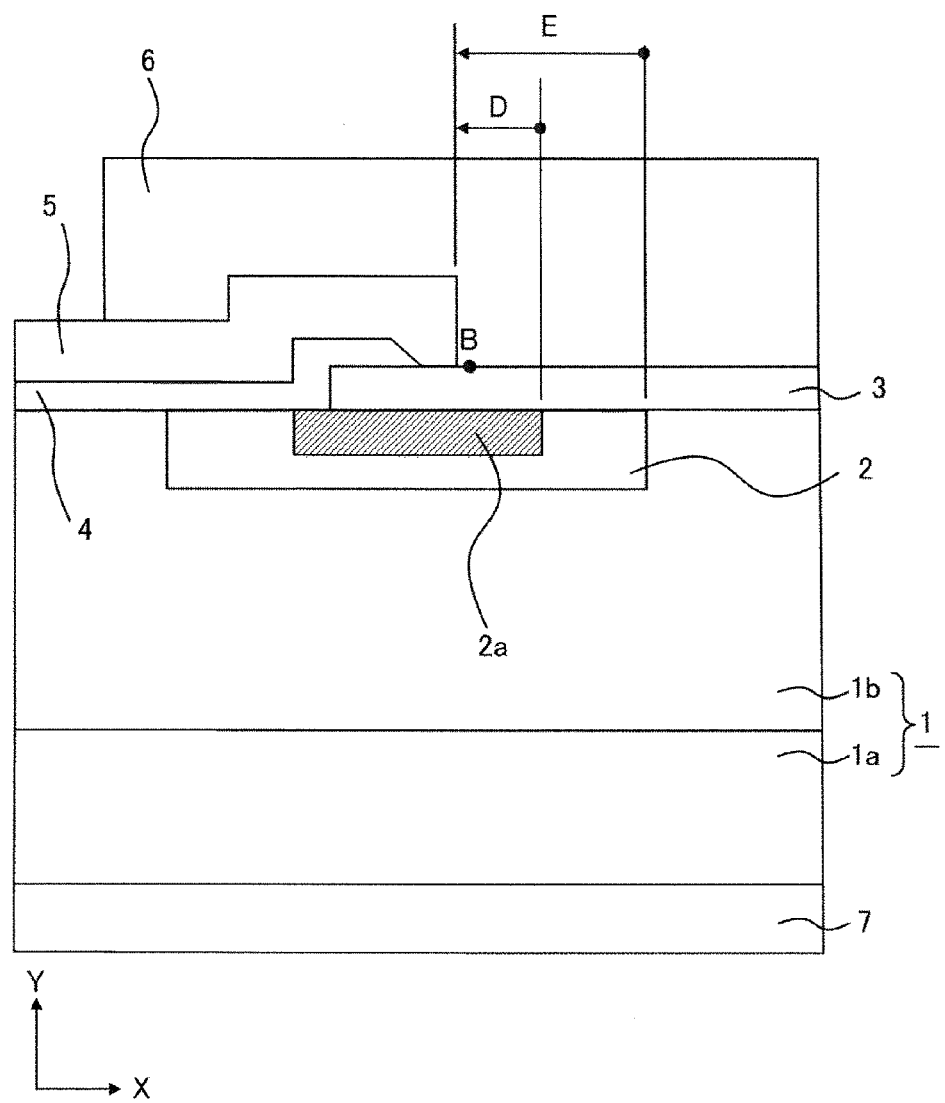
FIG. 8 is a cross-sectional view showing a simulation model of the silicon carbide semiconductor device according to the first preferred embodiment.

FIG. 8 is a cross-sectional view showing a simulation model for deriving the simulation results shown in FIGS. 6 and 7. In the simulation model shown in FIG. 8, the position and the structure of each constituent component and the thickness and the concentration of each constituent component except for the position of the peripheral edge of the front-surface electrode 5 are the same as those of this preferred embodiment described above. In the simulation shown in FIG. 6, the distance E between the peripheral edge of the front-surface electrode 5 and the peripheral edge of the terminal well region 2 is changed assuming that the distance between the peripheral edge of the terminal well region 2 and the high-concentration terminal well region 2a is fixed at 15 μm. In the simulation shown in FIG. 7, the distance D between the peripheral edge of the front-surface electrode 5 and the peripheral edge of the high-concentration terminal well region 2a is changed assuming that the distance E between the peripheral edge of the front-surface electrode 5 and the peripheral edge of the terminal well region 2 is fixed at 13 μm.

In FIGS. 6 to 8, both the distance D and the distance E are the distances extending in the horizontal direction assuming that the direction from the reference point toward the inner periphery side (the left side in FIG. 8) is the positive direction. Assuming that the reference point of the distance D is the peripheral edge of the high-concentration terminal well region 2a and the reference point of the distance E is the peripheral edge of the terminal well region 2, the distance D and the distance E respectively indicate the distances from the reference point to the peripheral edge of the front-surface electrode 5. In a case where the respective edge surfaces on the peripheral edge of the front-surface electrode 5, on the peripheral edge of the terminal well region 2, and on the peripheral edge of the high-concentration terminal well region 2a are oblique, the distance D and the distance E are calculated assuming that the peripheral lower edge of the front-surface electrode 5, the peripheral upper edge of the terminal well region 2, and the peripheral upper edge of the high-concentration terminal well region 2a are the reference points.

The electric field strength at the peripheral edge of the front-surface electrode 5 in these simulations refers to the electric field strength at the peripheral lower edge of the front-surface electrode 5. However, the peripheral lower edge of the front-surface electrode 5 is, in effect, a singular point. Thus, the electric field strength at a point B shown in FIG. 8, specifically, the electric field at the point located at a distance of 10 nm, on the outer periphery side in the X direction, from the peripheral lower edge of the front-surface electrode 5 is calculated (the same holds true for the other simulation results described below). Obviously, the simulation model shown in FIG. 8 corresponds to the right half of the silicon carbide semiconductor device 100 shown in FIG. 1A.

As shown in FIG. 6, the electric field strength in switching can be alleviated in accordance with an increase in the distance E between the peripheral edge of the front-surface electrode 5 and the terminal well region 2. Particularly, when the distance E is 15 μm or more, the electric field alleviation effect can be sufficiently provided. With the distance E of 15 μm or more, the electric field alleviation effect gradually becomes saturated. Thus, if the distance between the peripheral edge of the front-surface electrode 5 that provides the reference potential and the peripheral edge of the terminal well region 2 in which the voltage drop caused by the displacement current occurring in switching is maximized is sufficiently secured, the density of the equipotential lines between the peripheral edge of the front-surface electrode 5 and the peripheral edge of the terminal well region 2 is alleviated, whereby the electric field at the peripheral edge of the front-surface electrode 5 can be alleviated. The simulation results show in FIG. 6 are attributed from these factors. In addition, the electric field strength increases with an increase in the voltage variation amount dV/dt in switching. Thus, the electric field strength is shown to be a problem particularly in switching in the silicon carbide semiconductor device that is expected to operate faster than the conventional silicon semiconductor device.

In light of these results, the peripheral edge of the front-surface electrode 5 is located at a distance of 15 μm or more inward from the peripheral edge of the terminal well region 2 in this preferred embodiment, to thereby alleviate the electric field generated by the displacement current occurring in switching.

Moreover, as shown in FIG. 7, the electric field strength in switching decreases with an increase in the distance D between the peripheral edge of the front-surface electrode 5 and the peripheral edge of the high-concentration terminal well region 2a. Particularly, when the distance D is 2 μm or more, the electric field alleviation effect can be sufficiently provided. With the distance D of 2 μm or more, the electric field alleviation effect gradually becomes saturated. In addition, the electric field strength increases with the increasing voltage variation amount dV/dt in switching similarly to the results in FIG. 6. The simulation results shown in FIG. 7 are attributed from the following factors.

The high-concentration terminal well region 2a has a sheet resistance lower than that of the terminal well region 2, so that the voltage drop caused by the displacement current is smaller in the high-concentration terminal well region 2a. The peripheral edge of the front-surface electrode 5 is located over the high-concentration terminal well region 2a, to thereby alleviate the electric field at the peripheral edge of the front-surface electrode 5. However, in a case where the peripheral edge of the front-surface electrode 5 is located over the area around the boundary between the high-concentration terminal well region 2a and the terminal well region 2, the electric field alleviation effect cannot be sufficiently provided due to the effects of the electric field extending from the terminal-well-region-2 side in which the electric potential is high. Thus, the peripheral edge of the front-surface electrode 5 is located, on the high-concentration terminal well region 2a in which the electric potential is low, at a given distance or more on the inner periphery side, particularly, at 2 μm or more inward, whereby the electric field at the peripheral edge of the front-surface electrode 5 can be alleviated more effectively.

In light of these results, the peripheral edge of the front-surface electrode 5 is located at a distance of 2 μm or more inward from the peripheral edge of the high-concentration terminal well region 2a in this preferred embodiment. This alleviates the electric field generated by the displacement current occurring in switching. In addition, if the Schottky electrode 4 and the high-concentration terminal well region 2a are in direct contact with each other as in this preferred embodiment, the contact resistance in the displacement current path can be reduced, which can further alleviate the electric field generated in switching.

In the static off-state (dV/dt=0), although not shown in FIGS. 6 and 7, no displacement current flows and the voltage applied onto the anode electrode and the cathode electrode is held by the depletion layer between the terminal well region 2 and the silicon carbide semiconductor layer 1b. Therefore, as long as the peripheral edge of the front-surface electrode 5 is located over the terminal well region 2, the electric field applied onto the peripheral edge of the front-surface electrode 5 is, regardless of the position of the peripheral edge of the front-surface electrode 5, around the order of several $10^{14}$ [V/cm], which causes no problems. In switching, however, the electric field applied onto the peripheral edge of the front-surface electrode 5 may exceed the order of several $10^{15}$ [V/cm] as described above. Thus, the position of the peripheral edge of the front-surface electrode 5 needs to be adjusted.

Meanwhile, as a conceivable way to alleviate the electric field generated by the displacement current occurring in switching, the P-type impurity concentration may be increased in the terminal well region 2 as a whole, to thereby lower the sheet resistance in the terminal well region 2. However, as the P-type impurity concentration in the terminal well region 2 is increased, the electric field in the silicon carbide semiconductor layer 1b is increased in the static off-state, possibly causing a decrease in avalanche breakdown voltage. Assume that the avalanche breakdown voltage refers to, in a case where the voltage applied onto the silicon carbide semiconductor device is gradually increased, the voltage as of the occurrence of avalanche breakdown in the silicon carbide semiconductor device.

Figure 10:
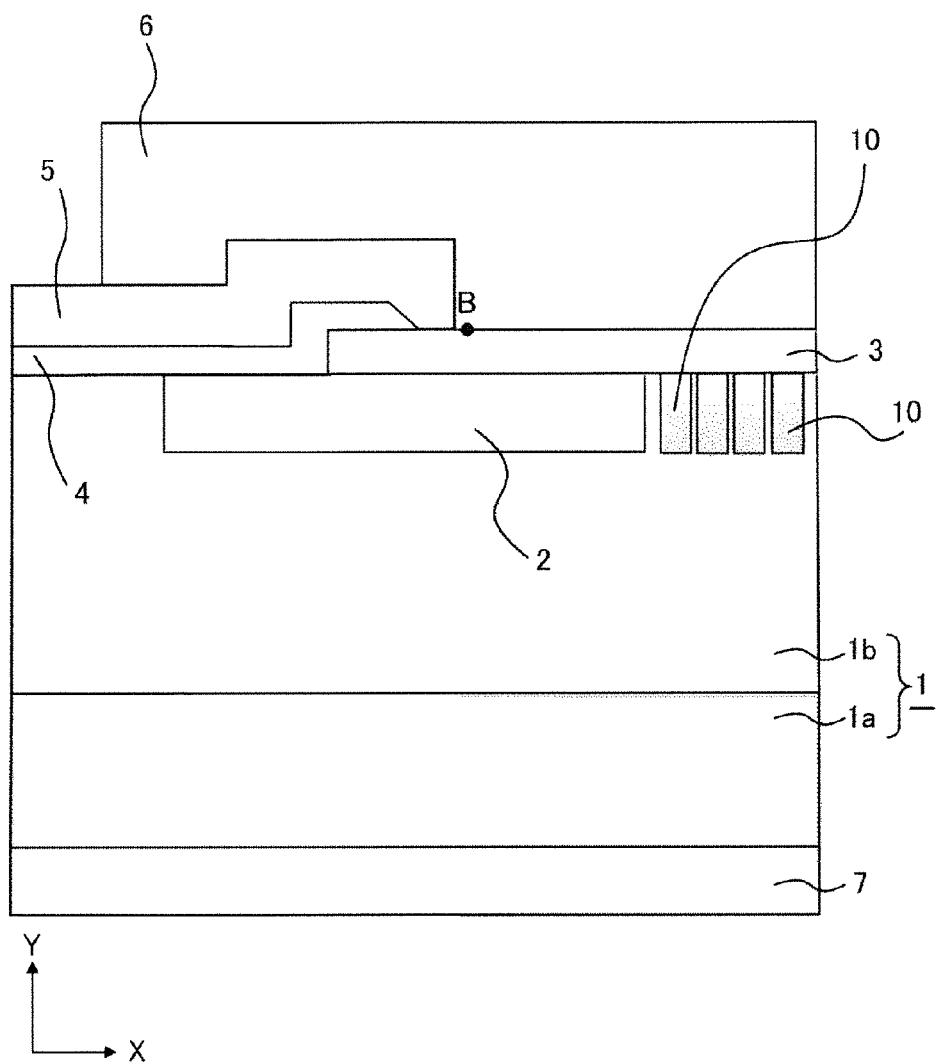
FIG. 10 is a cross-sectional view showing a simulation model of the silicon carbide semiconductor device according to the first preferred embodiment.

FIG. 9 shows simulation results that indicate relations between the P-type impurity amount in the terminal well region 2 per unit area [$cm^{-2}$] and the avalanche breakdown voltage. FIG. 10 is a cross-sectional view showing a simulation model used to derive the simulation results in FIG. 9. Although the simulation model shown in FIG. 10 is different from the silicon carbide semiconductor device 100 according to this preferred embodiment in that the high-concentration terminal well region 2a is not provided and a plurality of field limiting ring (FLR) regions 10 are provided, the configuration except for the above is similar. The thickness and the impurity concentration of the silicon carbide semiconductor layer 1b are designed assuming that the design voltage is 3.3 kV.

As shown in FIG. 9, the avalanche breakdown voltage decreases with an increase in the P-type impurity amount in the terminal well region 2 per unit area. This is attributed to the fact that the electric field at the end of the terminal well region 2 in the silicon carbide semiconductor layer 1b in the static off-state increases with an increase in the P-type impurity amount. Thus, if the P-type impurity amount in the terminal well region 2 is excessively increased in order to alleviate the electric field generated by the displacement current occurring in switching, the avalanche breakdown voltage of the silicon carbide semiconductor layer 1b decreases, possibly resulting in a decrease in element breakdown voltage. That is, there is a trade-off between the breakdown voltage (static breakdown voltage) determined by the electric field in the static off-state and the breakdown voltage (dynamic breakdown voltage) determined by the electric field in switching.

Therefore, in this preferred embodiment, the P-type impurity amount in the terminal well region 2 as a whole is set at $1.0 \times 10^{13}/cm^2$ to $1.0 \times 10^{14}/cm^2$ (more preferably, $2.0 \times 10^{13}/cm^2$ to $5.0 \times 10^{13}/cm^2$) and the high-concentration terminal well region 2a is provided only in a part of the terminal well region 2, so that the electric field generated by the displacement current occurring in switching is alleviated while the avalanche breakdown voltage is prevented from decreasing. Moreover, as described above, the peripheral edge of the front-surface electrode 5 is located at a distance of 2 μm or more inward from the peripheral edge of the high-concentration terminal well region 2a and at a distance of 15 μm or more inward from the peripheral edge of the terminal well region 2, so that the electric field generated by the displacement current in switching is further alleviated without decreasing the avalanche breakdown voltage.

Meanwhile, FIG. 11 shows simulation results that indicate relations between the P-type impurity amount in the high-concentration terminal well region 2a per unit area and the electric field strength at the peripheral edge of the front-surface electrode 5 in switching. The simulation results in FIG. 11 are derived using the simulation model shown in FIG. 8. Thus, the distance between the peripheral edge of the front-surface electrode 5 and the peripheral edge of the terminal well region 2 is fixed at 13 μm and the distance between the peripheral edge the high-concentration terminal well region 2a and the peripheral edge of the terminal well region 2 is fixed at 15 μm. In FIG. 11, the diamond-shaped markers indicate the simulation results in the case where the value of dV/dt is 20 kV/μs, the square markers indicate the simulation results in the case where the value of dV/dt is 30 kV/μs, the triangular markers indicate the simulation results in the case where the value of dV/dt is 40 kV/μs, and the circular markers indicate the simulation results in the case where the value of dV/dt is 50 kV/μs. In FIG. 11, the vertical line shown by alternate long and short dashed lines indicates the points where the P-type impurity amount is $2.0 \times 10^{14}/cm^2$.

As shown in FIG. 11, the electric field strength in switching is alleviated along with the increasing P-type impurity amount in the high-concentration terminal well region 2a. When the P-type impurity amount exceeds $2.0 \times 10^{14}/cm^2$, the electric field alleviation effect gradually becomes saturated. Therefore, the P-type impurity amount in the high-concentration terminal well region 2a is desirably set at $2.0 \times 10^{14}/cm^2$ or more. However, if the P-type impurity amount in the high-concentration terminal well region 2a is excessively increased, the avalanche breakdown voltage possibly decreases as described above even though the high-concentration terminal well region 2a is partially provided. For this reason, the P-type impurity amount in the high-concentration terminal well region 2a is desirably set at $1.0 \times 10^{15}/cm^2$ or below. That is, the electric field generated by the displacement current occurring in switching can be alleviated by setting the P-type impurity amount in the high-concentration terminal well region 2a at $2.0 \times 10^{14}/cm^2$ to $1.0 \times 10^{15}/cm^2$ as in this preferred embodiment.

Although the impurity amount is set to be constant in the terminal well region 2 except for the high-concentration terminal well region 2a as described above in this preferred embodiment, the so-called junction termination extension (JTE) region in which the impurity concentration decreases with an increasing distance toward the outer periphery side of the silicon carbide semiconductor layer 1b may be formed. For example, in the silicon carbide semiconductor device 100 according to this preferred embodiment, a low-concentration terminal well region in which the P-type impurity amount is smaller than that of the terminal well region 2 may be provided to be in contact with the terminal well region 2 on the outer periphery side relative to the terminal well region 2.

Although the example of the SBD formed of the silicon carbide semiconductor has been described in this preferred embodiment, as shown in FIG. 12, the so-called junction bather Schottky diode (JBS) and the so-called merged PiN Schottky diode (MPS) may be formed. That is, a plurality of active well regions 11 of the P type that are in ohmic contact with the Schottky electrode 4 in the active region of the silicon carbide semiconductor layer 1b and a plurality of high-concentration active well regions 11a of the P type that are provided in the active well regions 11 may be included, whereby the region in which the Schottky electrode 4 is in Schottky contact with the silicon carbide semiconductor layer 1b and the region in which the Schottky electrode 4 is in ohmic contact with the silicon carbide semiconductor layer 1b are formed alongside each other. The plurality of high-concentration active well regions 11a may be omitted in the JBS structure and the MPS structure.

Figure 13:
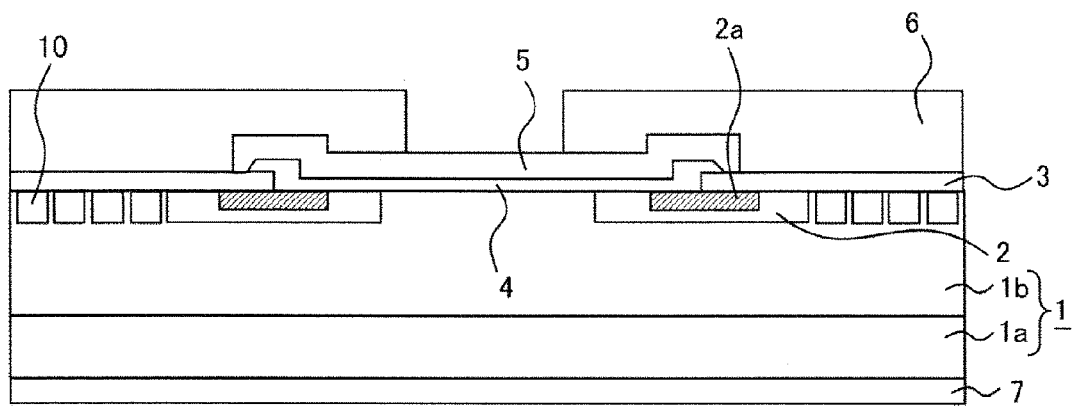

Although the terminal well region 2 and the high-concentration terminal well region 2a are included in this preferred embodiment, as shown in FIG. 13, the plurality of FLR regions 10 that are spaced apart from one another may be provided in the silicon carbide semiconductor layer 1b on the outer periphery side relative to the terminal well region 2. In the plurality of FLR regions 10, which are the P-type impurity regions, the P-type impurity amount is, for example, similar to that of the terminal well region 2. Similarly to the terminal well region 2, the plurality of FLR regions 10 each have a ring shape in a plan view (not shown).

Figure 14:
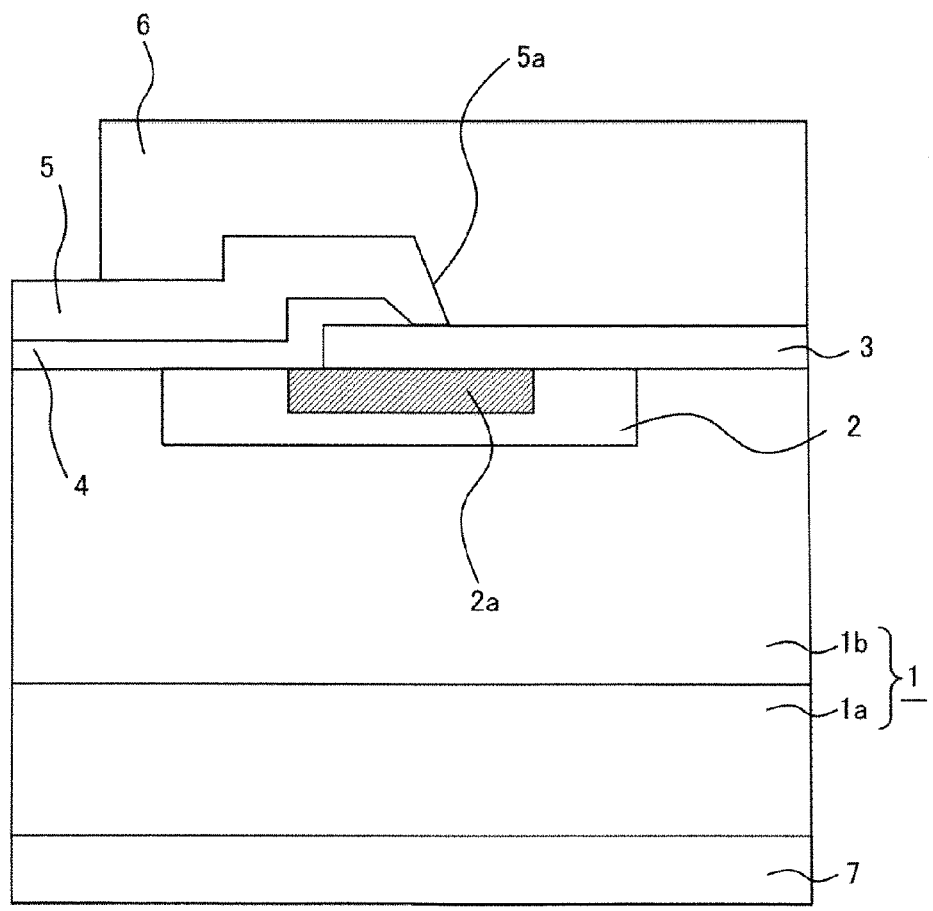

The configuration as in this preferred embodiment can alleviate the electric field at the peripheral edge, particularly, at the peripheral lower edge of the front-surface electrode 5. In this case, the peripheral edge of the front-surface electrode 5 may have a tapered shape so that the electric field at the peripheral upper edge of the front-surface electrode 5 is alleviated. FIG. 14 shows an example of the silicon carbide semiconductor device 100 according to this preferred embodiment in which the peripheral edge is transformed into a tapered shape.

With reference to FIG. 14, the front-surface electrode 5 has a tapered part 5a at the peripheral edge. In a case where the high-concentration terminal well region 2a is provided in the terminal well region 2 as in this preferred embodiment, the electric field at the peripheral lower edge of the front-surface electrode 5 can be effectively alleviated. Thus, by alleviating the electric field around the peripheral upper edge of the front-surface electrode 5, the electric field applied onto the field insulating film 3 and the surface protective film 6 can be further alleviated, which is expected to improve the reliability of the silicon carbide semiconductor device. Therefore, the front-surface electrode 5 has the tapered part at the peripheral edge as shown in FIG. 14, so that the curvature of the equipotential surfaces around the peripheral upper edge of the front-surface electrode 5 can be alleviated, allowing for the alleviation of the electric field at the peripheral upper edge.

The tapered shape defined by the tapered part 5a refers to a shape in which the upper edge position of the peripheral edge of the front-surface electrode 5 retreats on the inner periphery side relative to the lower edge position. The retreating amount of the peripheral upper edge is desirably 40% to 100% of the thickness of the front-surface electrode 5. Although the edge surface of the tapered part 5a is shown to be flat in FIG. 14, with the objective of alleviating the electric field at the peripheral upper edge that is one of the electric field concentration points, the edge surface of the tapered part 5a does not need to be flat in a strict sense and may have any shape as long as the peripheral upper edge retreats on the inner periphery side relative to the peripheral lower edge of the front-surface electrode 5.

Obviously, the silicon carbide semiconductor device 100 according to this preferred embodiment and the modifications of the silicon carbide semiconductor device according to this preferred embodiment that are shown in FIGS. 12 to 14 can be arbitrarily combined within the scope of the invention. For example, the FLR regions 10 shown in FIG. 13 can be combined with the JBS structure shown in FIG. 12. In addition, other combinations are obviously included within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A silicon carbide semiconductor device comprising:
   a silicon carbide semiconductor layer of a first conductivity type;
   a field insulating film formed on a surface of said silicon carbide semiconductor layer;
   a Schottky electrode formed on the surface of said silicon carbide semiconductor layer on an inner periphery side relative to said field insulating film, a peripheral edge of said Schottky electrode being formed to overlap onto said field insulating film;
   a front-surface electrode that covers said Schottky electrode and extends on said field insulating film beyond the peripheral edge of said Schottky electrode;
   a terminal well region of a second conductivity type that is formed to be in contact with a part of said Schottky electrode in an upper part of said silicon carbide semiconductor layer and extends in said silicon carbide semiconductor layer on an outer periphery side relative to a peripheral edge of said front-surface electrode; and
   a high-concentration terminal well region of the second conductivity type that is formed in said terminal well region and has a second-conductivity-type impurity concentration higher than that of said terminal well region,
   wherein the peripheral edge of said front-surface electrode is located at a distance of 15 μm or more inward from a peripheral edge of said terminal well region.

2. The silicon carbide semiconductor device according to claim 1, wherein the peripheral edge of said front-surface electrode is located over said high-concentration terminal well region.

3. The silicon carbide semiconductor device according to claim 1, wherein said field insulating film has a thickness of 0.5 µm or more.

4. The silicon carbide semiconductor device according to claim 1, wherein said high-concentration terminal well region and a part of said Schottky electrode are in contact with each other.

5. The silicon carbide semiconductor device according to claim 1, wherein a second-conductivity-type impurity amount contained in said terminal well region per unit area is $1.0 \times 10^{13}/cm^2$ to $1.0 \times 10^{14}/cm^2$.

6. The silicon carbide semiconductor device according to claim 1, wherein a peripheral edge portion of said front-surface electrode has a tapered part.

7. The silicon carbide semiconductor device according to claim 1, wherein said Schottky electrode contains at least one metal of titanium (Ti), molybdenum (Mo), nickel (Ni), and gold (Au).

8. The silicon carbide semiconductor device according to claim 1, wherein said front-surface electrode contains at least one metal of aluminum (Al), copper (Cu), molybdenum (Mo), and nickel (Ni).

9. A silicon carbide semiconductor device comprising:
a silicon carbide semiconductor layer of a first conductivity type;
a field insulating film formed on a surface of said silicon carbide semiconductor layer;
a Schottky electrode formed on the surface of said silicon carbide semiconductor layer on an inner periphery side relative to said field insulating film, a peripheral edge of said Schottky electrode being formed to overlap onto said field insulating film;
a front-surface electrode that covers said Schottky electrode and extends on said field insulating film beyond the peripheral edge of said Schottky electrode;
a terminal well region of a second conductivity type that is formed to be in contact with a part of said Schottky electrode in an upper part of said silicon carbide semiconductor layer and extends in said silicon carbide semiconductor layer on an outer periphery side relative to a peripheral edge of said front-surface electrode; and
a high-concentration terminal well region of the second conductivity type that is formed in said terminal well region and has a second-conductivity-type impurity concentration higher than that of said terminal well region,
wherein the peripheral edge of said front-surface electrode is located at a distance of 2 µm or more inward from a peripheral edge of said high-concentration terminal well region.

10. The silicon carbide semiconductor device according to claim 9, wherein the peripheral edge of said front-surface electrode is located over said high-concentration terminal well region.

11. The silicon carbide semiconductor device according to claim 9, wherein said field insulating film has a thickness of 0.5 µm or more.

12. The silicon carbide semiconductor device according to claim 9, wherein said high-concentration terminal well region and a part of said Schottky electrode are in contact with each other.

13. The silicon carbide semiconductor device according to claim 9, wherein a second-conductivity-type impurity amount contained in said terminal well region per unit area is $1.0 \times 10^{13}/cm^2$ to $1.0 \times 10^{14}/cm^2$.

14. The silicon carbide semiconductor device according to claim 9, wherein a peripheral edge portion of said front-surface electrode has a tapered part.

15. The silicon carbide semiconductor device according to claim 9, wherein said Schottky electrode contains at least one metal of titanium (Ti), molybdenum (Mo), nickel (Ni), and gold (Au).

16. The silicon carbide semiconductor device according to claim 9, wherein said front-surface electrode contains at least one metal of aluminum (Al), copper (Cu), molybdenum (Mo), and nickel (Ni).

17. A silicon carbide semiconductor device comprising:
a silicon carbide semiconductor layer of a first conductivity type;
a field insulating film formed on a part of a surface of said silicon carbide semiconductor layer;
a Schottky electrode formed on a part of the surface of said silicon carbide semiconductor layer on an inner periphery side relative to said field insulating film, a peripheral edge of said Schottky electrode being formed to overlap onto said field insulating film;
a front-surface electrode that covers said Schottky electrode and extends on said field insulating film beyond the peripheral edge of said Schottky electrode;
a terminal well region of a second conductivity type that is formed to be in contact with a part of said Schottky electrode in an upper part of said silicon carbide semiconductor layer and extends in said silicon carbide semiconductor layer on an outer periphery side relative to a peripheral edge of said front-surface electrode; and
a high-concentration terminal well region of the second conductivity type that is formed in said terminal well region and has a second-conductivity-type impurity concentration higher than that of said terminal well region,
wherein a second-conductivity-type impurity amount contained in said high-concentration terminal well region per unit area is $2.0 \times 10^{14}/cm^2$ or more.

18. The silicon carbide semiconductor device according to claim 17, wherein the peripheral edge of said front-surface electrode is located over said high-concentration terminal well region.

19. The silicon carbide semiconductor device according to claim 17, wherein said field insulating film has a thickness of 0.5 µm or more.

20. The silicon carbide semiconductor device according to claim 17, wherein said high-concentration terminal well region and a part of said Schottky electrode are in contact with each other.

21. The silicon carbide semiconductor device according to claim 17, wherein a second-conductivity-type impurity amount contained in said terminal well region per unit area is $1.0 \times 10^{13}/cm^2$ to $1.0 \times 10^{14}/cm^2$.

22. The silicon carbide semiconductor device according to claim 17, wherein a peripheral edge portion of said front-surface electrode has a tapered part.

23. The silicon carbide semiconductor device according to claim 17, wherein said Schottky electrode contains at least one metal of titanium (Ti), molybdenum (Mo), nickel (Ni), and gold (Au).

24. The silicon carbide semiconductor device according to claim 17, wherein said front-surface electrode contains at least one metal of aluminum (Al), copper (Cu), molybdenum (Mo), and nickel (Ni).

* * * * *